LOW-NOISE TRAVELLING WAVE TUBE AMPLIFIER
Filed Nov. 22, 1967
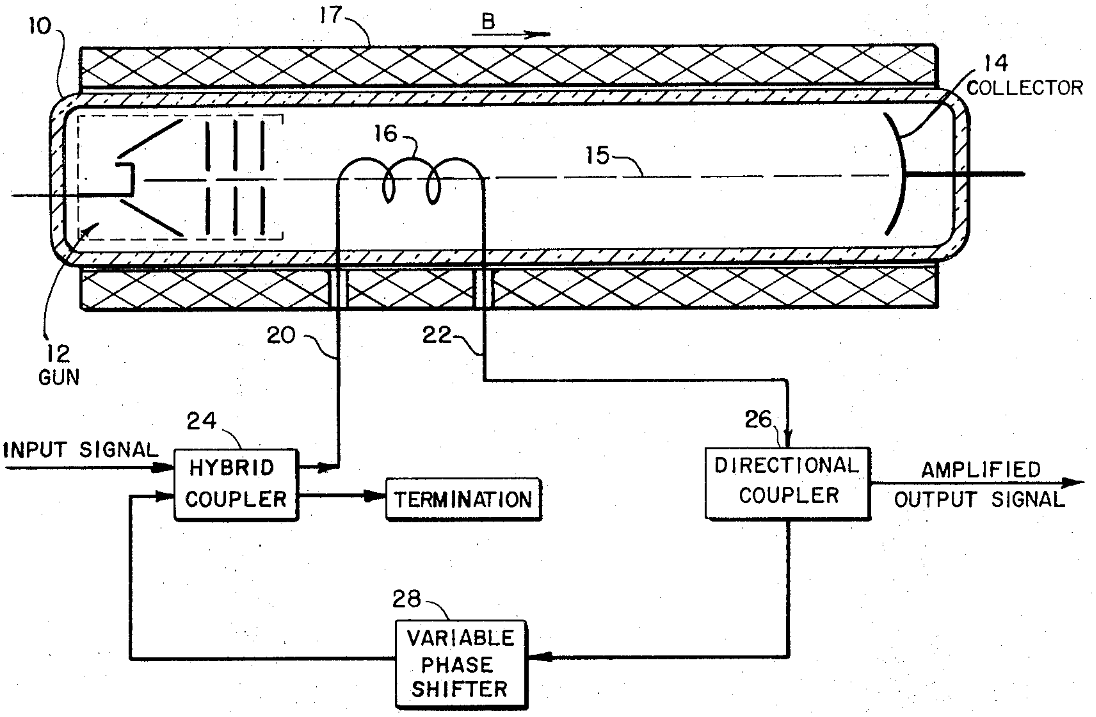
INVENTORS
CHARLES M. DE SANTIS
BRUNO W. ZOTTER.
BY Jack H. Stanley AGENT.
Harry M. Saragovitz
Edward J. Kelly + Herbert Berl
ATTORNEYS

United States Patent Office 3,529,257
Patented Sept. 15, 1970

3,529,257

LOW-NOISE TRAVELLING WAVE TUBE AMPLIFIER

Charles M. DeSantis, Neptune, and Bruno W. Zotter, Belmar, N.J., assignors to the United States of America as represented by the Secretary of the Army Filed Nov. 22, 1967, Ser. No. 685,208
Int. Cl. H03f 3/58
U.S. Cl. 330—43 4 Claims

ABSTRACT OF THE DISCLOSURE

A low-noise microwave travelling wave tube amplifier in which the interaction length of the slow-wave structure is very short and the beam is initially decoupled from the slow-wave structure such that only enough gain is achieved to overcome the inherent losses of the amplifier and maintain the noise figure at a minimum. A positive feedback path is provided from the output of the amplifier back to the input of the amplifier through a phase shifter and hybrid circuit such that the gain of the amplifier is increased without increasing the noise figure.

The invention described herein may be manufactured, used, and licensed by or for the Government for governmental purposes without the payment to us of any royalty thereon.

BACKGROUND OF THE INVENTION

This invention relates to travelling wave tube amplifiers and more particularly to such amplifiers wherein a very low-noise level is achieved.

It is well known that the noise figure of a travelling wave tube amplifier is mainly due to two sources, namely, the thermal noise originating at the hot cathode, and the noise due to losses of the slow-wave structure. The losses of the slow-wave structure may be minimized and made arbitrarily small by plating its surface with low loss material. The thermal noise from the cathode may also be minimized by proper design of the electron gun. However, since there exists two uncorrelated noise sources, shot noise and velocity fluctuations, the thermal noise from the cathode cannot be made arbitrarily small. While it is known that decoupling of the beam from the slow-wave circuit not only reduces gain but also noise, the reduction of the noise figure by reducing gain does not constitute an advantage inasmuch as the noise figure of a second amplifier stage will predominate in the overall noise figure of an amplifier chain.

SUMMARY OF THE INVENTION

It is an object of the present invention to provide an improved travelling wave tube amplifier wherein the aforementioned limitations are overcome.

It is another object of the present invention to provide an improved travelling wave tube amplifier wherein the gain may be enhanced without increasing the noise figure.

In accordance with the present invention there is provided a low-noise TWT microwave amplifier which includes means for producing an axial electron beam, a collector electrode for intercepting the axial electron beam and a relatively short slow-wave structure intermediate the electron beam producing means and the collector electrode and in coupling relationship to the beam. Also included are means for decoupling the beam from the slow-wave structure. The degree of decoupling and the length of the slow-wave propagating structure are such that the interaction of the beam with the slow-wave structure provides a gain just sufficient to overcome the inherent loss in the TWT. Included further are discrete means for respectively coupling a signal into and out of said slow-wave structure, and means for feeding back the amplified output signal to the input coupling means whereby the amplified signal is in phase with the input signal. The feedback path thus comprises a positive feedback circuit so that the gain of the amplifier is increased without substantially increasing the noise which adds in random phase.

BRIEF DESCRIPTION OF THE DRAWING

For a better understanding of the invention reference is made to the accompanying drawing which illustrates a preferred embodiment of the invention.

DESCRIPTION OF THE PREFERRED EMBODIMENT

Referring now to the drawing, there is shown at 10 a travelling wave tube having a conventional electron gun 12 and a collector 14 for providing an axial beam 15. The interaction structure 16 intermediate electron gun 12 and collector 14 may comprise a helix or other suitable slow-wave structure. An axial magnetic field indicated by the arrow B may be provided by means of a solenoid 17 which may be energized by any suitable means well known in the art. The axial length of the slow-wave structure 16 is made very short electrically, for example, in the order of a few wavelengths. The diameter of the beam 15 passing through the slow-wave structure 16 is made relatively narrow by means well known in the art and the beam may be further controlled by a strong longitudinal magnetic field. The narrowness of the beam and the strong longitudinal magnetic field provide the means to decouple the electron beam for the slow-wave structure so as to minimize the interaction between the electron beam 15 and slow-wave structure 16. The strength of the magnetic field B and the axial length of the slow-wave circuit 16 are chosen such that the beam is sufficiently decoupled from slow-wave circuit 16 whereby any gain in the tube 10 due to the interaction of the electron beam 15 and slow-wave structure 16 is just sufficient to overcome the conventional inherent losses in the tube 10. The input lead 20 to slow-wave structure 16 is at the electron gun end of the tube 10 and the output lead 22 of slow-wave structure 16 is at the collector end of tube 10. The input signal to be amplified is applied to one port of the three port hybrid-junction or coupler 24, preferably in the form of a hybrid ring. The signal applied to the hybrid ring 24 is coupled through a second port thereof to the input lead 20 of slow-wave structure 16 and is propagated along the slow-wave structure to interact with the beam 15. The amplified signal from output lead 22 of slow-wave structure 16 is coupled to a directional coupler circuit 26 which provides an amplified output signal from tube 10 and also permits some of the output energy to be applied to a phase shifter 28. As shown, phase shifter 28 is connected between a third port of hybrid ring 24 and one output of directional coupler 26. The phase shifter 28 is adjusted so that the amplified output signal from tube 10 is in-phase with the input signal to hybrid ring 24. Thus, a positive feedback path is provided for applying an amplified signal from the output of slow-wave structure 16 back to the signal input coupling of the travelling wave tube 10. It is to be understood of course that suitable conventional waveguide coupling circuits may be utilized to couple the signal into and out of slow-wave structure 16. The hybrid ring 24 is of a type known to the art and is dimensioned and is so arranged that it serves to isolate the input signal and the amplified phase shifted signal applied thereto.

In operation, the initial reduction of the gain of the travelling wave tube 10 by decoupling of the beam from slow-wave circuit 16 will actually decrease the noise figure. The decoupling of the beam from slow-wave structure 16 has the effect of producing only a slightly amplified signal with a considerably reduced noise figure which is proportional to $(1-1/G)$, where G is the gain of the tube. Since the positive feedback signal is fed into the input at the correct phase, its amplitude will add to the incoming signal every time it travels around the loop. Since the signals add in phase, while the noise adds only in power because of its randomness, the signal-to-noise ratio will be greatly enhanced. The above does constitute a decrease in the noise figure over a bandwidth which is reduced by the same factor.

While there has been described what is at present considered to be the preferred embodiment of this invention, it will be obvious to those skilled in the art that various changes and modifications may be made therein without departing from the invention.

What is claimed is:

1. In a travelling wave tube amplifier having means for producing a relatively narrow axial electron beam, a collector electrode for intercepting said beam, and a very short slow-wave structure consisting of a coil located intermediate said electron beam producing means and said collector electrode in coupling relationship to said beam, means for reducing the noise figure in an amplified output signal derived from said tube comprising a magnetic means for producing a longitudinal magnetic field of a magnitude sufficient to decouple said beam from said slow-wave structure such that the interaction therebetween generates an initial gain to overcome the inherent losses of said travelling wave tube, input signal coupling means connected to one end of the coil of the slow-wave structure for coupling input signals into said slow-wave structure, output coupling means connected to the other end of said coil of the slow-wave structure for providing an output signal and a positive feedback signal, and feedback means comprising a variable phase shifter coupled between said output coupling means and said input coupling means for maintaining the phase of the output signal in phase with the input signal.

2. The system in accordance with claim 1 wherein said input signal coupling means comprises a hybrid ring.

3. The system in accordance with claim 2 wherein said output coupling means comprises a directional coupler having two outputs, and said feedback means comprises an adjustable phase shifter interconnecting one output of said directional coupler to a port of said hybrid ring.

4. The system in accordance with claim 3 wherein said slow-wave structure is a short helix.

References Cited

UNITED STATES PATENTS

| | | | |
|---|---|---|---|
| 2,770,722 | 11/1956 | Arams | 330—43 X |
| 2,787,673 | 4/1957 | Cutler | 330—43 |
| 3,048,794 | 8/1962 | Ares | 330—43 X |
| 3,277,373 | 10/1966 | Allen | 330—43 X |

NATHAN KAUFMAN, Primary Examiner

U.S. Cl. X.R.

330—44